United States Patent
Van Helvoort

(10) Patent No.: US 7,667,463 B2
(45) Date of Patent: Feb. 23, 2010

(54) ANTENNA FOR PICKING UP MAGNETIC RESONANCE SIGNALS AND PROVIDED WITH ITS OWN COMMUNICATION UNIT

(75) Inventor: Marinus J. A. M. Van Helvoort, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 147 days.

(21) Appl. No.: 11/911,208

(22) PCT Filed: Apr. 7, 2006

(86) PCT No.: PCT/IB2006/051072

§ 371 (c)(1),
(2), (4) Date: Oct. 11, 2007

(87) PCT Pub. No.: WO2006/109229

PCT Pub. Date: Oct. 19, 2006

(65) Prior Publication Data

US 2009/0121713 A1    May 14, 2009

(30) Foreign Application Priority Data

Apr. 15, 2005  (EP) .................. 05102994

(51) Int. Cl.
*G01V 3/00* (2006.01)
(52) U.S. Cl. ....................... 324/322; 324/318
(58) Field of Classification Search ......... 324/300–322; 600/407–445
See application file for complete search history.

(56) References Cited

U.S. PATENT DOCUMENTS

| | | | | |
|---|---|---|---|---|
| 5,245,288 A | * | 9/1993 | Leussler | 324/322 |
| 5,914,696 A | * | 6/1999 | Vanderhelm et al. | 343/841 |
| 6,026,286 A | * | 2/2000 | Long | 455/327 |
| 6,218,834 B1 | * | 4/2001 | Goto | 324/307 |
| 6,545,475 B2 | | 4/2003 | Kroeckel et al. | |
| 6,710,597 B2 | * | 3/2004 | Reykowski et al. | 324/318 |
| 6,768,917 B1 | | 7/2004 | Van Vaaels | |
| 7,067,839 B2 | * | 6/2006 | Uzawa et al. | 257/31 |
| 7,230,425 B2 | * | 6/2007 | Leussler | 324/318 |
| 2003/0206019 A1 | | 11/2003 | Boskamp | |

FOREIGN PATENT DOCUMENTS

| | | |
|---|---|---|
| GB | 490383 | 8/1938 |
| WO | 03032002 A1 | 4/2003 |
| WO | 2004093002 A1 | 3/2004 |

OTHER PUBLICATIONS

Gonord, P., et al.; Multigap parallel-plate bracelet resonator frequency determination and applications; 1994; Rev. Sci. Instrum.; 65(11)3363-3366.

* cited by examiner

*Primary Examiner*—Brij B Shrivastav

(57) ABSTRACT

An RF receiver antenna (1), notably for use in an magnetic resonance imaging system for picking up magnetic resonance signals comprises a resonant pick-up circuit and communication unit (2) to transmit and/or receive data and including a transmit/receive antenna integrated in the resonant pick-up circuit.

12 Claims, 2 Drawing Sheets

Figure 1:
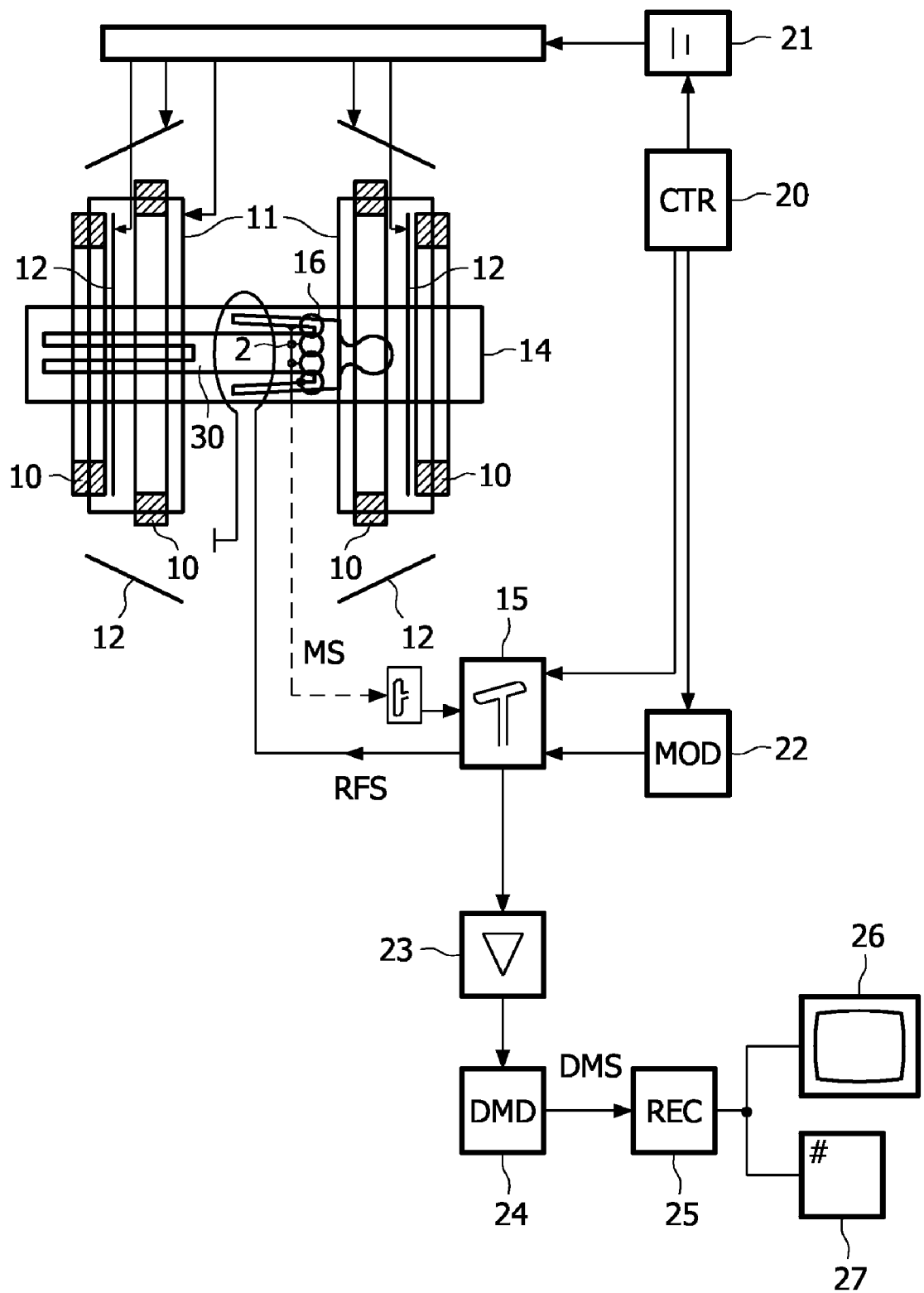

ANTENNA FOR PICKING UP MAGNETIC RESONANCE SIGNALS AND PROVIDED WITH ITS OWN COMMUNICATION UNIT

The invention relates to an RF receiver antenna, notably an RF receiver coil, for receiving magnetic resonance signals.

The invention also pertains to an magnetic resonance imaging system in which one or several RF receiver antennae are employed.

Such an magnetic resonance imaging system is known from the international application WO 03/032002.

The known magnetic resonance imaging system comprises a main magnet assembly which is located in an MR-suite. The magnetic resonance imaging system is provided with RF receiver coils to receive magnetic resonance signals form a patient to be examined. The MR-suite is preferably shielded from electromagnetic radiation, notably within the RF frequency bands. A sequence control is provided to generate MR imaging sequences and is located outside of the MR suite. A reconstruction unit is provided to reconstruct magnetic resonance images from magnetic resonance signals acquired. Communication between the sequence control, the reconstruction unit outside of the MR-suite and the magnetic resonance imaging system within the MR-suite is implemented in a wireless way. In particular, gradient waveforms and RF pulse patterns are communicated into the MR-suite to a wireless transceiver on the magnetic resonance imaging system. The RF receiver coils can be directly connected to the wireless transceiver in the MR-suite or the RF receiver coils can be in radio communication with the wireless transceiver in the MR-suite. There are provided transceivers on the individual RF receiver coils. Handshaking protocols are applied between the RF receiver coils and the wireless transceiver in the MR suite to identify the RF receiver coils being connected. The magnetic resonance signals received by the MR receiver coils are wireless communicated to the reconstruction unit which reconstructs the magnetic resonance images from the received magnetic resonance signals.

An object of the invention is to provide an RF receiver antenna that is capable of wireless communication and has a simple structure.

This object is achieved by the RF receiver antenna of the invention which comprises
 a resonant pick-up circuit
 a communication unit to transmit and/or receive data and including a transmit/receive antenna integrated in the resonant pick-up circuit.

The RF receiver antenna of the invention has a communication unit on board. The transmit/receive antenna that communicates magnetic resonance signals from the RF receiver antenna to the magnetic resonance imaging system and which receives control signals from the magnetic resonance imaging system is integrated in the resonant pick-up circuit. Because the RF receiver antenna is provided with its own communication unit, it is easy to add RF receiver antenna to the magnetic resonance imaging system which is immediately, following a handshake recognition protocol, able to communicate with the magnetic resonance imaging system. Because the transmit/receive antenna is integrated in the resonant pick-up circuit, a relatively small number of electronic components is required to construct the RF receiver antenna. Moreover, no separate antenna is required inconveniently protruding from the RF receiver coil's resonant pick-up circuit.

These and other aspects of the invention will be further elaborated with reference to the embodiments defined in the dependent Claims.

According to one aspect of the invention, the transmit/receive antenna is integrated in the resonant pick-up circuit in that one of the segments of the resonant pick-up circuit is employed as the transmit/receive antenna. In one option the transmit/receiver antenna has a length of an integer number of half wavelengths $$\left(\frac{n\lambda}{2}, n=1,2,3,\ldots\right)$$

at the carrier frequency of the transmitted or received signals. Another option is to employ a quarter wavelength (stub) antenna, of which the length is an odd number of quarter wavelengths $$\left(\frac{(2k+1)\lambda}{4}, k=0,1,2,3,\ldots\right).$$

These half-wavelength and quarter wavelength antenna types have a very good efficiency in radiating energy into or receiving energy from free space. Accurate tuning can be further The communicated unit is arranged to mix magnetic resonance signals picked up by the resonant-pick up circuit with a carrier frequency. In general the magnetic resonance signals are in RF frequency bands between 10 MHz and 600 MHz. The actual value depends on the strength of the main magnetic field of the magnetic resonance imaging system. The resonant pick-up circuit has a good sensitivity for magnetic resonance signals in the RF frequency band relevant for the magnetic resonance imaging system at issue. Data transmission to and from the RF receiver antenna is performed at much higher frequencies, typically above 1 GHz, notably 2.4 GHz is comfortable. Different RF transmission and receipt frequency bands can be employed for transmission and receipt of data, respectively. Notably, when different RF transmission and receipt RF frequency bands are employed, good results are obtained with the quarter wavelength transmit/receive antenna. Such a quarter wavelength transmit/receive antenna has in operation a maximum electrical current at its feeding point and zero current at its end remote from the feeding point, i.e. at the top end of the antenna. This leads to an efficient energy transfer at a relatively short antenna length.

According to a further aspect of the invention the segments of the resonant pick-up circuit are physically interrupted and a partly inductive coupling is provided between adjacent segments. The inductive aspect of the coupling effectively behaves like a short circuit a low frequencies and as an open circuit interruption at high frequencies. The capacitive aspect of the coupling effectively behaves like a short circuit a low frequencies and as an open circuit interruption at high frequencies. Hence, the selection of the amount of induction/capacitance applied to the interruption between the segments allows to tune the effectiveness of the interruption in the relevant frequency range.

The invention also relates to an magnetic resonance imaging system. The magnetic resonance imaging system of the invention is provided with an RF receiver antenna of the invention. The magnetic resonance imaging system of the invention is capable of easy variation of the RF receiver antenna that are employed to pick-up the magnetic resonance signals. Often, the RF receiver antenna is formed as a RF receiver surface coil that can be placed over a relevant portion of the patient to be examined. The magnetic resonance imaging system of the invention may be a so-called cylindrical system in which the magnetic field is formed in a cylindrical bore. Usually cylindrical magnetic resonance imaging system operate at a magnetic field strength of 1.5, 3 or even 7 or 11 Tesla. Often cylindrical magnetic resonance imaging systems are employed to perform for example cardiac, neurological (brain) or abdominal examinations. On the other hand, the magnetic resonance imaging system of the invention may be an open type magnetic resonance imaging system. Such open type magnetic resonance imaging system have opposing pole faces connected by a carrier like a C-shape stand or a four post structure that functions a magnetic flux return path. Between the opposing pole face the magnetic field is applied of about 0.25 to 1 Tesla These and other aspects of the invention will be elucidated with reference to the embodiments described hereinafter and with reference to the accompanying drawing wherein FIG. 1 shows diagrammatically a magnetic resonance imaging system in which the invention is used and FIG. 2 shows diagrammatically an MR RF receive loop of the RF receiver antenna of the invention.

Figure 2:
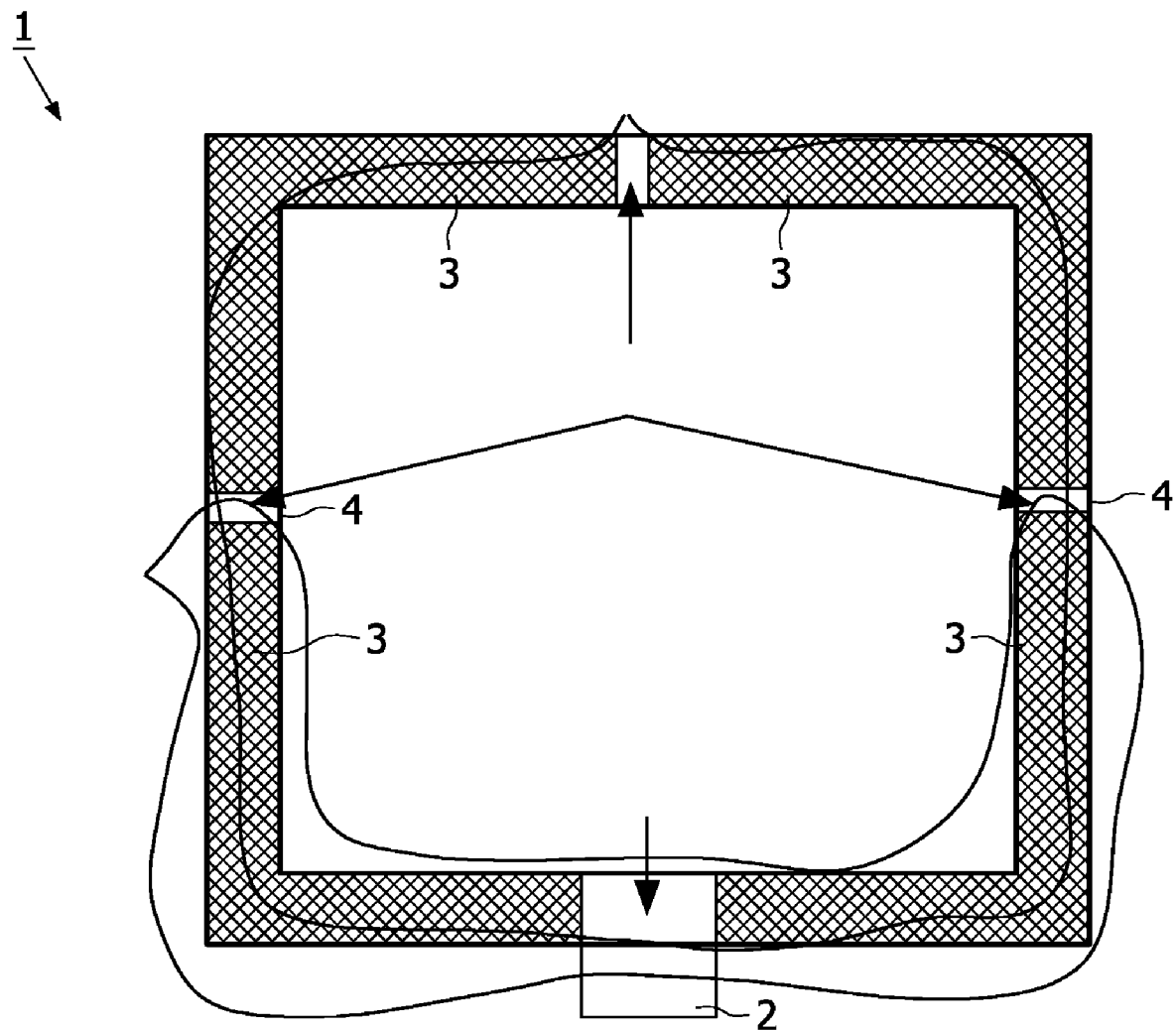

FIG. 1 shows diagrammatically a magnetic resonance imaging system in which the invention is used. The magnetic resonance imaging system includes a set of main coils 10 whereby the steady, uniform magnetic field is generated. The main coils are constructed, for example in such a manner that they enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. the gradient coils 11, 12 are energised by application of an electric current by means of the power supply unit 21; to this end the power supply unit is fitted with electronic gradient amplification circuit that applies the electric current to the gradient coils so as to generate gradient pulses (also termed 'gradient waveforms') of appropriate temporal shape The strength, direction and duration of the gradients are controlled by control of the power supply unit. The magnetic resonance imaging system also includes transmission and receiving coils 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is usually used alternately as the transmission coil and the receiving coil. Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transmission and receiving circuit 15. The transmission and receiving unit is fitted with an antenna 17 to enable wireless communication with the surface coils 15.

It is to be noted that it is alternatively possible to use separate receiving and/or transmission coils 16. For example, surface coils 16 can be used as receiving and/or transmission coils. Such surface coils have a high sensitivity in a comparatively small volume. The receiving coils, such as the surface coils, are connected to a demodulator 24 and the received magnetic resonance signals (MS) are demodulated by means of the demodulator 24. The demodulated magnetic resonance signals (DMS) are applied to a reconstruction unit. The receiving coil is connected to a preamplifier 23. The preamplifier 23 amplifies the RF resonance signal (MS) received by the receiving coil 16 and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. It is noted that in the magnetic resonance imaging system of the present invention the modulation includes digitisation before transmission. The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction monitor 26, so that the monitor can display the magnetic resonance image. It is alternatively possible to store the signal from the reconstruction unit 25 in a buffer unit 27 while awaiting further processing.

The surface coils 16 are provided with communication units 2 that have the transmit/receive antenna integrated in the resonant pick-up circuit of the individual surface coil 16. Details are shown in FIG. 2. There is provided a wireless link between the surface coils 16 and the transmission and receiver unit 15 of the magnetic resonance imaging system.

The magnetic resonance imaging system according to the invention is also provided with a control unit 20, for example in the form of a computer which includes a (micro)processor. The control unit 20 controls the execution of the RF excitations and the application of the temporary gradient fields. To this end, the computer program according to the invention is loaded, for example, into the control unit 20 and the reconstruction unit 25. FIG. 2 shows diagrammatically an MR RF receive loop of the RF receiver antenna 1 of the invention. The antenna comprises a resonant pick-up circuit 4 formed by the MR RF receive loop. The resonant pick-up circuit 4 is combined with the communication unit 2 that functions to wireless communicate to the magnetic resonance imaging system. The resonant pick-up circuit 4 has several circuit segments 3. Some, in this example 2 of these circuit segments are coupled to the communication unit 2 and function as transmit receive antenna via which the communication unit 2 exchanges data and control commands with the magnetic resonance imaging system notably with the transmission and receiving unit 15. The transmission of these data and commands are carried out at higher frequencies, typically above 1 GHz, notably around 2.4 GHz.

At these frequencies small quarter or half wavelength segments operate satisfactorily. E.g. at 2.4 GHz the quarter wavelength is about 3 cm.

In the RF receiver antenna of the invention the circuit segments are interrupted as many interruptions can be used as necessary, but segments connected to, as seen from the communication unit are at a distance of a quarter wavelength of the data transmission signal. With this implementation the data antenna is integrated in the already existing coil antenna element without degrading performance. One can choose for a half wavelength or quarter wavelength (stub) antenna. In case of a quarter wavelength antennas it is also possible to use to of them with slightly different carrier frequencies, thus having separate carriers for transmit and receive, or additional channel bandwidth.

The capacitor values, loop shape and other interruptions are determined by the coil design requirements, the rest of the loop will put a capacitive or inductive load on the data antenna. Therefore the real length typically will be slightly shorter or longer than a quarter of half wave length in order to compensate for this load. The real length can be found with electromagnetic simulation software (or via limited trial-and-error). An alternative is to use a not purely capacitive component at the interruption forming the data antenna.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. An RF receiver antenna for picking up magnetic resonance signals comprising:
   a communication unit is arranged to operate at a carrier wavelength to transmit and/or receive data,
   a resonant pick-up circuit, the resonant pick-up circuit including:
      several circuit segments that are mutually interrupted,
      at least one of the circuit segments having an effective length of about one quarter the carrier wavelength or of about one half the carrier wavelength, and
      a transmit/receive antenna integrated in the resonant pick-up circuit.

2. A magnetic resonance system comprising:
   main coils which generate a steady magnetic field;
   an RF transmission system which transmits RF excitation and refocusing pulses; and
   the RF receiver antenna as claimed in claim 1.

3. The RF receiver antenna as claimed in claim 1, wherein at least one interruption between adjacent segments has a partly inductive coupling between the adjacent circuit segments.

4. An RF receiver antenna for picking up magnetic resonance signals comprising:
   a communication unit arranged to operate at a carrier frequency,
   a resonant pick-up circuit including: several circuit segments that are mutually interrupted,
      at least one interruption between adjacent circuit segments,
      a partly inductive coupling between the adjacent circuit segments, and
      at least one of the segments being connected with the communication unit to wirelessly transmit and/or receive data to and/or from a transmission and/or receiving unit of a magnetic resonance system.

5. The RF receiver antenna as claimed in claim 4, wherein at least one of the circuit segments has an effective physical length of about N times a quarter carrier wavelength, where N is a positive integer.

6. The RF receiver antenna as claimed in claim 4, wherein the carrier frequency is about 2.4 GHz.

7. A magnetic resonance system comprising:
   main coils which generate a steady magnetic field;
   gradient coils which generate magnetic fields exhibiting spatial variations;
   a transmission and receiving system;
   the RF receiver antenna as claimed in claim 4;
   an MR reconstruction unit connected with the transmission and receiving system to process the data received thereby.

8. The magnetic resonance system as claimed in claim 7, further including:
   a control unit connected with the transmission and receiving system to supply control commands to be transmitted to the communication unit.

9. An RF receiver antenna for picking up magnetic resonance signals comprising:
   a resonant pick-up circuit having a transmit/receive antenna integrated therein;
   a communication unit to transmit and/or receive data, the communication unit being arranged to operate:
      at a transmission carrier wavelength band for transmission of data, and
      at a receiver carrier wavelength band for receipt of data.

10. A magnetic resonance imaging system comprising an RF receiver antenna as claimed in claim 9.

11. The RF receiver antenna as claimed in claim 9, wherein the resonant pick-up circuit includes a plurality of circuit segments, at least one segment functioning as the transmit/receive antenna.

12. The RF receiver antenna as claimed in claim 11, wherein at least one of the segments has an effective physical size of a multiple of a quarter wavelength in the transmission and/or receiver carrier wavelength band.

* * * * *